US012695454B2

(12) United States Patent
Marques et al.

(10) Patent No.: US 12,695,454 B2
(45) Date of Patent: Jul. 28, 2026

(54) SINGLE COMPARATOR BASED COMPARISON OF AN INPUT VOLTAGE AGAINST MULTIPLE REFERENCE VOLTAGES

(71) Applicant: Shaoxing Yuanfang Semiconductor Co., Ltd., Shaoxing (CN)

(72) Inventors: Pedro Filipe Francisco Marques, Armés (PT); Michael Figueiredo, Amora (PT); Arnold J. D'Souza, Bangalore (IN); Shyam Somayajula, Bangalore (IN); Yunsong Wang, Shanghai (CN); Yiren Wang, Shanghai (CN)

(73) Assignee: Ningbo Aura Semiconductor Co., Ltd, Ningbo (CN)

( * ) Notice: Subject to any disclaimer, the term of this patent is extended or adjusted under 35 U.S.C. 154(b) by 20 days.

(21) Appl. No.: 18/926,384

(22) Filed: Oct. 25, 2024

(65) Prior Publication Data

US 2026/0019084 A1    Jan. 15, 2026

(30) Foreign Application Priority Data

Jul. 11, 2024    (IN) .............................. 202441053138

(51) Int. Cl.
*H03K 5/08*        (2006.01)
*G06F 1/26*        (2006.01)
(Continued)

(52) U.S. Cl.
CPC ............. *H03K 19/173* (2013.01); *G06F 1/26* (2013.01); *H02M 3/156* (2013.01)

(58) Field of Classification Search
CPC ............ H03K 5/01; H03K 5/08; H03K 5/082; H03K 5/084; H03K 5/086; H03K 5/088;
(Continued)

(56) References Cited

U.S. PATENT DOCUMENTS 7,671,574 B1 *   3/2010   Burinskiy ........... H02M 3/1588
                                                323/284
11,228,169 B1    1/2022   Xiong et al.
(Continued)

FOREIGN PATENT DOCUMENTS

CN        203491665 U      3/2014
CN        105977905 B      1/2019

OTHER PUBLICATIONS

Core Independent Voltage Window Signal Detection Using a single comparator technical brief, https://ww1.microchip.com/downloads/en/AppNotes/TB3221-Core-Independent-Voltage-Window-Signal-Detection-90003221A.pdf, Jun. 28, 2019, 15 pages, Microchip Technology Incorporated, USA.
(Continued)

*Primary Examiner* — Long Nguyen
(74) *Attorney, Agent, or Firm* — IPHORIZONS PLLC; Narendra Reddy Thappeta

(57)            ABSTRACT

According to an aspect, a comparison circuit includes (A) a comparator to compare a comparator input with a comparator reference and generate a comparator output; (B) a mode selector to generate as a mode value, a first logic value if an input voltage (provided at a first node) is below a mid-voltage and a second logic value otherwise; (C) a first branch (coupled between the first node and a second node) to generate a first voltage drop approximately equaling a difference between a first reference voltage and the comparator reference; (D) a second branch (coupled between the first node and a second node) to generate a second voltage drop approximately equaling a difference between a second reference voltage and the comparator reference; and (E) a selection circuit to couple one of the second node or the third node as the comparator input according to the mode value.

16 Claims, 5 Drawing Sheets

(51) Int. Cl.
  *H02M 3/156* (2006.01)
  *H03K 19/173* (2006.01)
(58) Field of Classification Search
  CPC .......... H03K 5/22; H03K 5/24; H03K 5/2472;
    H03K 5/2481; H03K 5/249; H03K
    19/173; G01R 19/165; G01R 19/16566;
    G01R 19/16571; G01R 19/16576; G01R
    19/1659; G01R 19/16595; G06F 1/26;
    G06F 1/263; G06F 1/30; H02M 3/156
  See application file for complete search history.

(56) References Cited

U.S. PATENT DOCUMENTS

| | | | |
|---|---|---|---|
| 11,411,387 | B2 | 8/2022 | Jain et al. |
| 11,428,749 | B2 | 8/2022 | Gupta et al. |
| 2013/0063177 | A1 | 3/2013 | Lopez Rodriguez et al. |
| 2018/0205215 | A1 | 7/2018 | Su et al. |
| 2019/0260199 | A1 | 8/2019 | Turcan |

OTHER PUBLICATIONS

T.M. Thamizh Thentral, Implementation of protection circuit for over voltage and under voltage protection, Dec. 19, 2020, 5 pages.
TPS3702 High-Accuracy Over and Undervoltage Monitoring, https://www.ti.com/lit/ds/symlink/tps3702.pdf?ts=1721217277067&ref_url=https%253A%252F%252Fwww.google.com%252F, Jan. 2015-Feb. 2024, 31 pages, Texas Instruments, Texas.
Barry A. Mather, Single comparator based A/D converter for output voltage sensing in power factor correction rectifiers, Sep. 2009, 8 pages.

\* cited by examiner

SINGLE COMPARATOR BASED COMPARISON OF AN INPUT VOLTAGE AGAINST MULTIPLE REFERENCE VOLTAGES

PRIORITY CLAIM

The instant patent application is related to and claims priority from the co-pending provisional India patent application entitled, "Single Comparator Voltage Sensing", Serial No.: 202441053138, Filed: 11 Jul. 2024; which is incorporated in its entirety herewith to the extent not inconsistent with the description herein.

BACKGROUND

Technical Field

Embodiments of the present disclosure relate generally to electronic circuits, and more specifically to a single comparator-based comparison of an input voltage against multiple reference voltages.

Related Art

A comparator is a circuit which generates a first logic value if a comparator input voltage is greater than a comparator reference voltage, and a second logic value otherwise. Such a comparator can be used for performing comparison of an input voltage of interest against a single reference voltage.

There is often a need to compare such an input voltage of interest to multiple reference voltages. For example, a circuit or system may be designed to operate in different voltage levels, and it may be desirable to determine if the input voltage is below or above each of such voltage levels.

In one prior approach, multiple comparators are used for performing comparisons against corresponding number of reference voltages. However, such an approach may not be desirable at least when there is limited area on a die/integrated circuit (IC) chip.

Aspects of the present disclosure are directed to a single comparator-based comparison of an input voltage against multiple reference voltages.

BRIEF DESCRIPTION OF THE VIEWS OF DRAWINGS

Example embodiments of the present disclosure will be described with reference to the accompanying drawings briefly described below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

Figure 1:
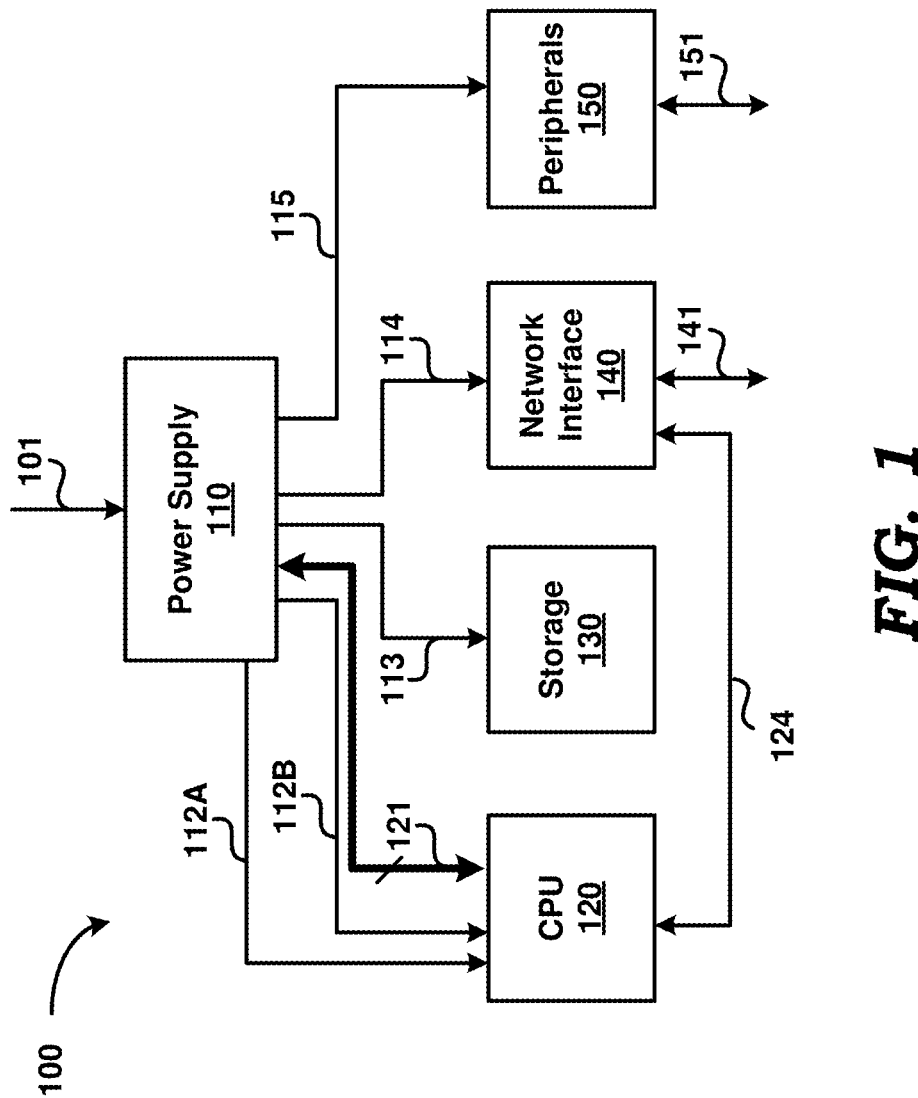
FIG. 1 is a block diagram of an example system in which several aspects of the present disclosure can be implemented.

A comparison circuit provided according to an aspect of the present disclosure uses a single comparator to compare an input voltage against multiple reference voltages and indicates a comparison output as well as the specific reference voltage to which the comparison output relates.

In an embodiment, the comparison circuit includes the single comparator which compares a comparator input with a comparator reference and generates a comparator output. The comparison circuit includes a mode selector to generate as a mode value, a first logic value if an input voltage is below a mid-voltage and a second logic value otherwise, with the mid-voltage being between a first reference voltage and a second reference voltage of interest, wherein the first reference voltage is lower than the second reference voltage. The comparison circuit includes a first branch coupled to receive the input voltage at a first node, and generate a first voltage drop relative to the input voltage at a second node, with the first voltage drop approximately equaling a difference between the first reference voltage and the comparator reference.

The comparison circuit includes a second branch coupled to receive the input voltage at the first node, and generate a second voltage drop relative to the input voltage at a third node, with the second voltage drop approximately equaling a difference between the second reference voltage and the comparator reference. The comparison circuit includes a selection circuit to couple one of the second node or the third node as the comparator input according to the mode value. The mode value indicates whether the comparator output represents comparison with respect to the first reference voltage or the second reference voltage, and the comparator output indicates whether the input voltage is above or below the specific reference voltage thus compared.

According to another aspect of the present disclosure, the first branch contains a first resistor, a first current source, and a first switch coupled in series, with the first resistor and the first current source together generating the first voltage drop. The second branch contains a second resistor, a second current source, and a second switch coupled in series, with the second resistor and the second current source together generating the second voltage drop. The selection circuit turns on only one of the first switch and the second switch based on the mode value.

According to one more aspect of the present disclosure, the mode selector contains a third resistor and a third current source in series with the first node to together generate a voltage drop equaling the mid-voltage relative to the input voltage at a fourth node. A first inverter is connected to the fourth node to generate the mode value.

According to yet another aspect of the present disclosure, the selection circuit contains a second inverter coupled in series to the first inverter, where an output of the second inverter is coupled to the first switch, and an output of the first inverter is coupled to the second switch.

According to an aspect of the present disclosure. the input voltage is an instantaneous voltage of an input signal.

Several aspects of the present disclosure are described below with reference to examples for illustration. However, one skilled in the relevant art will recognize that the disclosure can be practiced without one or more of the specific details or with other methods, components, materials and so forth. In other instances, well-known structures, materials, or operations are not shown in detail to avoid obscuring the features of the disclosure. Furthermore, the features/aspects described can be practiced in various combinations, though only some of the combinations are described herein for conciseness.

2. Example System

FIG. 1 is a block diagram of an example system in which several aspects of the present disclosure can be implemented. System 100 is shown containing power supply 110, central processing unit (CPU) 120, storage 130, network interface 140 and peripherals 150. In an embodiment, system 100 corresponds to a computer (desktop, laptop, etc.), although system 100 can represent other types of systems in other embodiments. It is understood that system 100 can contain more or fewer blocks than those shown in FIG. 1.

CPU 120, in general, represents a processor or a system-on-chip (SoC), and is shown as receiving a pair of supply voltages (Va and Vb) on respective paths 112A and 112B from power supply 110. As an example, Va may be a smaller voltage than Vb, and may be used to power a core portion of CPU which may include arithmetic logic unit (ALU), microprogram sequencer, registers, etc. Vb may be used to power the rest of CPU 120, such as for example, input/output (I/O) units, I/O buffers, on-chip peripherals etc. CPU 120 provides various signals (all deemed to be contained in bidirectional path/bus 121) specifying, among others, its power supply requirements to power supply 110. Examples of such signals can be those that specify the specific mode of operation (in terms of power consumption) such as PS1, PS2, PS3, etc., which refer to "Power Save States for Improved Efficiency".

Storage 130 represents a memory that may include both volatile and non-volatile memories. For example, in a personal computer, storage can include magnetic memory (hard disk) as well as solid state memory (RAM, Flash, etc.). Storage 130 is shown receiving a supply voltage on path 113 for powering various circuits and blocks within.

Network interface 140 operates to provided two-way communication between system 100 and a computer network, or in general the Internet. Network interface 140 implements the electronic circuitry required to communicate using a specific physical layer and data link layer standard such as Ethernet or Wi-Fi™. Network interface 140 may also contain a network protocol stack to allow communication with other computers on a same local area network (LAN) and large-scale network communications through routable protocols, such as Internet Protocol (IP). Network interface 140 receives a power supply on path 114 for powering internal circuits and blocks. Network interface 140 receives from/transmits to external systems and CPU 120 respectively on path 141 and path 124.

Peripherals 150 represents one or more peripheral circuits, such as for example, speakers, microphones, user interface devices, etc. Peripherals 150 receives a power supply on path 115, and communicates with external devices on path 151.

Power supply 110 receives power from one or more sources (e.g., battery) on path 101, and operates to provide the desired power supply voltages on paths 112A, 112B, 113, 114 and 115. In an embodiment, power supply 110 is designed to contain one or more multi-phase DC-DC converters within to generate the power supply voltages. Power supply 110 receives signals from CPU 120 received on path 121 that may indicate power-modes in which CPU 120 is to operate in a particular duration, with the power-modes representing a magnitude of power that CPU 120 is likely to require/consume from power supply 110. Power supply 110 responds to the signals by controlling the multi-phase converter(s) to reduce/increase current output based on the specific power-mode signal (e.g., PS1, PS2 and PS3).

In an embodiment, power supply 110 is a voltage regulator module (VRM), sometimes also called processor power module (PPM), and contains one or more step-down switching (buck) converters to generate one or more smaller voltages from a higher-voltage supply source. In other embodiments however, other types of DC-DC converters such as boost, buck-boost, hysteretic converters etc., can be implemented instead of a buck converter. With a VRM, multiple devices/ICs requiring different supply voltages can be mounted on the same platform, for example, a computer motherboard of a personal computer (PC). An example implementation of a voltage regulator module (VRM) is described in detail below.

3. Voltage Regulator Module (VRM)

Figure 2:
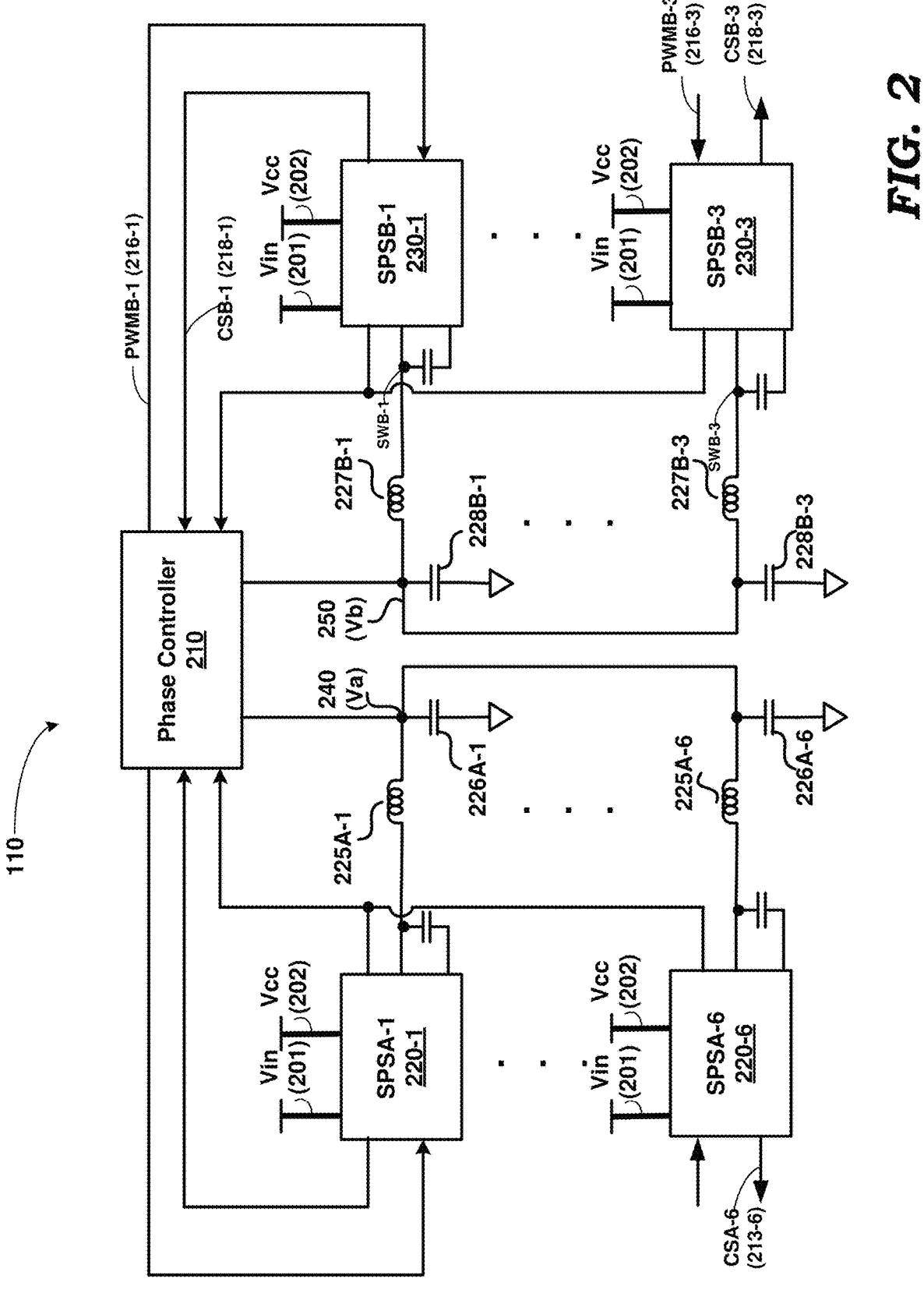
FIG. 2 is a block diagram illustrating the details of a voltage regulator module (VRM) in an embodiment of the present disclosure.

FIG. 2 is a block diagram illustrating the details of a VRM in an embodiment of the present disclosure. Power Supply 110 (of FIG. 1) is a Voltage Regulator Module implemented in the form of a multi-phase switching converter generating two regulated voltages, i.e., two supply rails (power rails), namely Va (240) (Rail-A) and Vb (250) (Rail-B). Nodes 240 and 250 may respectively be also viewed as the power rails. In FIG. 2, the supply source used for deriving Va and Vb is shown numbered 201, and has a voltage Vin. An example value of Vin in an embodiment of VRM 110 is about 21 volts (V). Also shown is a supply voltage Vcc (202), which may be provided by phase controller 210, and which may be used for powering the blocks within each power stage noted below.

VRM 110 is shown containing phase controller 210, smart power stages (SPS) (or 'power stages') SPSA-1 (220-1) through SPSA-3 (220-3), SPSB-1 (230-1) through SPSB-4 (230-4), inductors 225A-1 through 225A-3 and 227B-1 through 227B-4 and capacitors 226A-1 through 226A-3 and 228B-1 through 228B-4. Power supply Va (240) (Rail-A) is generated by a 3-phase buck converter (there are three SPSes—220-1 through 220-3), while power supply Vb (250) (Rail-B) is generated by a 4-phase buck converter (there are four SPSes—230-1 through 230-4). Nodes/Paths 240 and 250 can correspond to paths 112A and 112B of FIG. 1. In the interest of conciseness, other power supply circuits that generate supplies on paths 113, 114 and 115 are not shown in FIG. 2. In alternative embodiments, VRM 110 can have more or fewer power rails as well as power stages per rail.

In an embodiment of the present disclosure, each of the power stages as well as the phase controller is implemented as separate integrated circuits (ICs). However, in other embodiments, the implementations of the power stages and phase controller may be different.

Phase controller 210 in conjunction with one or more power stages of a rail operates to generate a regulated voltage as output. In the example of FIG. 2, phase controller 210 in combination with one or more of power stages SPSA-1 through SPSA-3 operates to generate regulated voltage Va (240). Similarly, phase controller 210 in combination with one or more of power stages SPSB-1 through SPSB-4 operates to generate regulated voltage Vb (250).

Accordingly, Va (240) and Vb (250) are shown as being provided as inputs to phase controller 210 to enable operation of one or more feedback loops within phase controller 210 to regulate voltages Va and Vb. Phase controller 210 also receives inductor-current information (regarding current flowing through each of the inductors) from each of the SPSes to enable various operations such as current-mode control of voltage regulation, current limiting, short circuit protection, and balancing the currents generated by each SPS of a same converter (or 'rail') so as to make the currents from each SPS of a rail to be substantially equal in magnitude. The other signals flowing between phase controller 210 and the SPSes are described below.

The combination of (corresponding circuitry within) phase controller 210, an SPS and the corresponding inductor and capacitor forms one "phase" of a rail. Thus, for example, SPSA-1, inductor 225A-1, capacitor 226A-1, and the corresponding portion within phase controller 210 form a single buck converter, and one phase of the 3-phase buck converter. It is noted here that, while each phase is shown as having its own separate capacitor (e.g., 226A-1), in another embodiment, only a single larger capacitor (larger capacitance) may be employed at node 240 (as well as 250). In other embodiments, multiple capacitors are placed close to the load powered by the corresponding supply voltage. For simplicity, an individual SPS is also referred to as a phase of a power-rail. Each power stage is also shown to have a capacitor (Cboot) connected to it to enable operation of the high-side switch within it when the high-side switch is implemented as an N-channel MOSFET (NMOS-N-channel Metal oxide semiconductor field effect transistor).

Each SPS (or in general a 'power stage') may be implemented to contain a high-side switch, a low-side switch, gate-drive circuitry for the two switches, a temperature monitor circuit and an inductor-current-sense circuit/block to provide information indicating the magnitude of inductor-current to phase controller 210. The current supplied by an SPS, and therefore the corresponding inductor-current generally depends on the load current drawn from the supply voltage, although the high-side switch and low-side switch of an SPS may be viewed as 'driving' the inductor. Each SPS receives a source of power (which can all be the same source) as an input which is connected to the high-side switch (shown in detail in sections below). An example implementation of a power stage (SPS) is described in detail below.

4. Power Stage (SPS)

Figure 3:
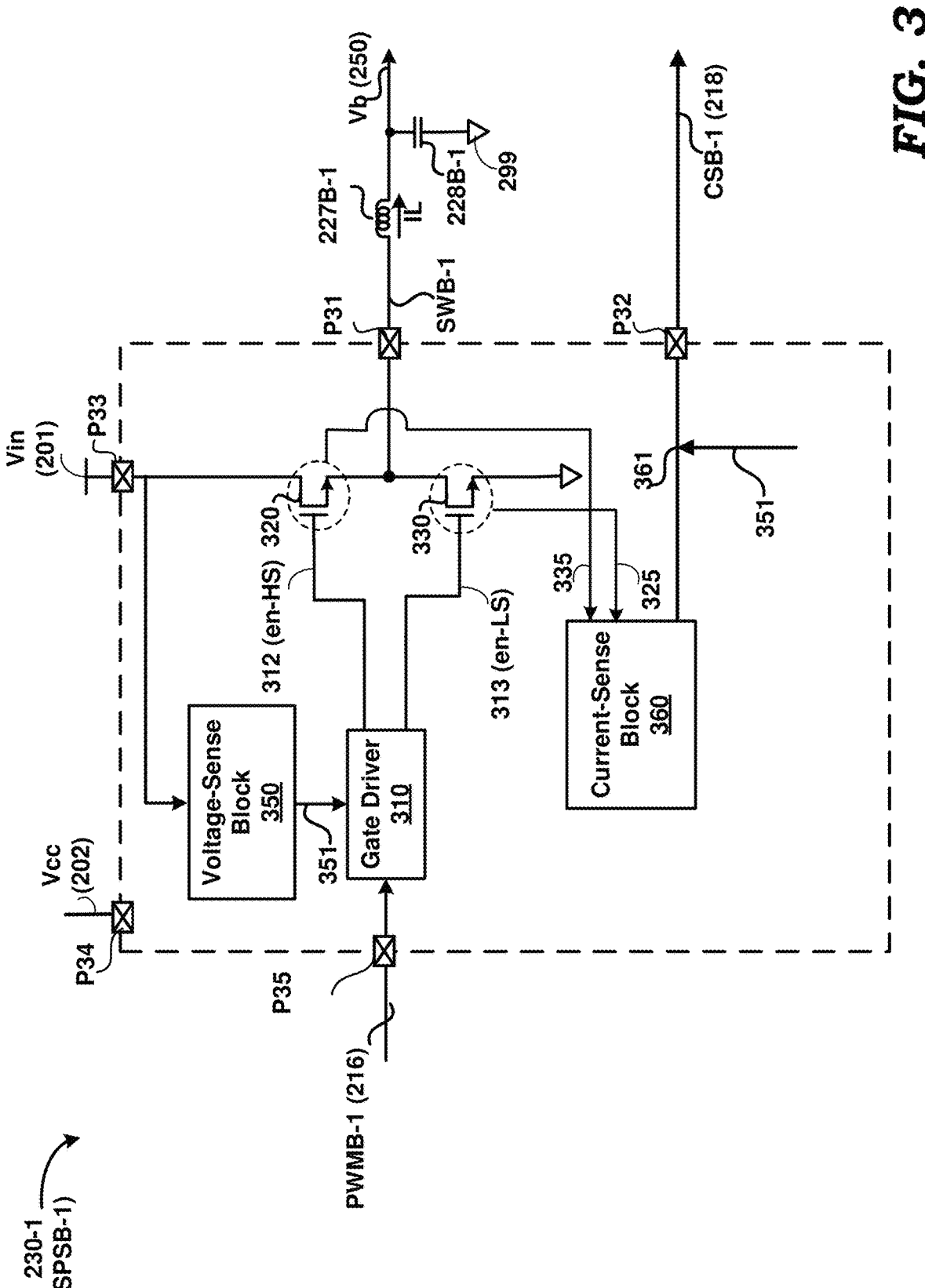
FIG. 3 is a diagram illustrating the implementation details of a power stage in an embodiment of the present disclosure.

FIG. 3 is a diagram illustrating the implementation details of a power stage in an embodiment of the present disclosure. Power stage 230-1 (SPSB-1) of FIG. 2 is shown there containing gate driver 310, high-side (HS) switch 320, low-side (LS) switch 330, fault communication block 340, voltage-sense block 350 and current-sense block 360. Also shown in FIG. 3 are inductor 227B-1 and capacitor 228B-1 corresponding to the power stage. P31 through P36 represent pins of SPSB-1 when implemented as an integrated circuit (IC). In alternative implementations, P31 through P35 represent circuit nodes. Current 'IL" represents the inductor-current flowing through inductor 227B-1. Vcc (202) is used to power blocks 310, 340, 350 and 360. The drain terminal of HS switch 320 is connected to Vin (201).

Power stage 230-1, in combination with inductor 325 and capacitor 326, and phase controller 210 provides a regulated voltage (Vb) as output on node 250. Although not shown in FIG. 3 in the interest of conciseness, power stage 300 may contain various other blocks/circuits such as level-converters for gate driver 310, temperature sensors, etc. All the other power stages of FIG. 2 (of rail-B and optionally of rail-A also) may be implemented similar to power stage 230-1 and as further described below.

Gate driver 310 receives a PWM (Pulse-width Modulation) signal PWMB-1 (216) (from phase controller 210), and in response to the logic level of the PWM signal generates the appropriate voltages on path 312 (en-HS) and 313 (en-LS) to turn ON and turn OFF HS switch 320 and LS switch 330 respectively in corresponding intervals, and as indicated by the logic levels of the PWM signal. HS switch 320 and LS switch 330 are each shown implemented as an N-channel MOSFET (Metal Oxide Semiconductor Field Effect Transistor) with gate driver 310 driving the gate terminals of the MOSFETs. Other implementations for the switches are also possible.

In the example of FIG. 3, when PWMB-1 is a logic HIGH, gate driver 310 generates respective appropriate voltages on paths 312 (en-HS) and 313 (en-LS) to switch-ON MOSFET 320 and switch-OFF MOSFET 330. When PWMB-1 is a logic LOW, gate driver 310 generates respective appropriate voltages on paths 312 and 313 to switch-OFF MOSFET 320 and switch-ON MOSFET 330. When PWMB-1 is a Hi-Z (High-impedance or mid-rail) state, gate driver 310 generates the respective appropriate voltages on paths 312 and 313 to switch-OFF both of MOSFET 320 and 330. Gate driver 310 can be implemented in a known way.

As described in detail below, voltage-sense block 350 determines whether input voltage Vin is within an acceptable range, e.g., between an under-voltage/lower limit (Vin_uv) and an over-voltage/upper limit (Vin_ov). The acceptable range may include the limits Vin_uv and Vin_ov also. As described below, when/if Vin is outside the acceptable range, voltage-sense block 350 asserts tri-state signal 351, but otherwise maintains signal 351 in an open or high-impedance state. Gate driver 310 receives signal 351 in an asserted state when/if Vin is outside the acceptable range, and in response drives both of signals 312 and 313 to switch-OFF the respective power switches 320 and 330. When asserted signal 351 is also available on pin P32, with the output of current-sense block 360 disconnected from path 361.

Current-sense block 360 operates to determine the magnitude (for example, instantaneous magnitude) of the inductor-current through inductor 227B-1, and provides information indicating the inductor-current magnitude on its output node (internal to block 360) onto path 351, which is connected to output pin P32. Pin P32 is connected to phase controller 210 by path CSB-1 (218). Current-sense block 360 may determine the magnitude of the inductor-current by one of several known ways. For example, in FIG. 3 current-sense block 360 is shown as receiving inputs 325 and 335 respectively from HS switch 320 and LS switch 330.

In an embodiment, signals 325 and 335 represent the respective voltage-drops across the HS and LS switches when the corresponding switch is ON and current is flowing through it and inductor 227B-1. Current-sense block 360 obtains the instantaneous magnitude of the inductor-current (or a scaled-down version thereof) based on the voltage-drops. In an embodiment, current-sense block 360 provides/reports the inductor-current information in the form of a (replica) current (sensed-current) having a magnitude that is scaled-down with respect to the instantaneous inductor-current magnitude. However, in alternative embodiments, current-sense block 360 can be implemented to provide the information in the form of a voltage or a digital value(s).

Current-sense block 360 contains an internal switch (or other suitable circuit) to electrically disconnect its output node from path 351, and therefore pin P32, when both of power switches 320 and 330 are switched OFF by gate driver block 310 in response to an indication via signal 351 that Vin is outside the acceptable range. Asserted signal 351 is instead provided to pin P32 and is available via path CSB-1 (218) to phase controller 210. Such disconnection can be done in a known way, and the mechanism and command for such disconnection is not shown or described herein in the interest of conciseness. Phase controller 210, in response to receiving asserted signal 351, may take suitable action to indicate such a condition to a user.

As described above, power stage 230-1 (SPSB-1) may need to sense several voltages to be in optimal working condition. For example, it may be desirable that Vin (201) be checked/sensed for under-voltage (less than a lower reference value/lower limit Vin_uv, such as 4.2V) and over-voltage (greater than a higher reference value/upper limit Vin_ov, such as 22V). That is, the input voltage Vin may need to be compared with multiple reference voltages to determine if Vin is within an acceptable range.

Voltage-sense block 350, provided according to several aspects of the present disclosure, facilitates the comparison of an input voltage (e.g., Vin) with multiple reference voltages. As noted in the 'Background' sections, in a prior approach, separate comparators are used for each of the multiple comparisons (against the multiple reference voltages). The use of multiple comparators would result in correspondingly greater power consumption and incur higher implementation area. Voltage-sense block 350, implemented according to several aspects of the present disclosure, employs only one comparator for comparing Vin with multiple reference voltages. An example implementation of such a single comparator-based comparison circuit is described in detail below.

5. Single Comparator Based Comparison Circuit

Figure 4:
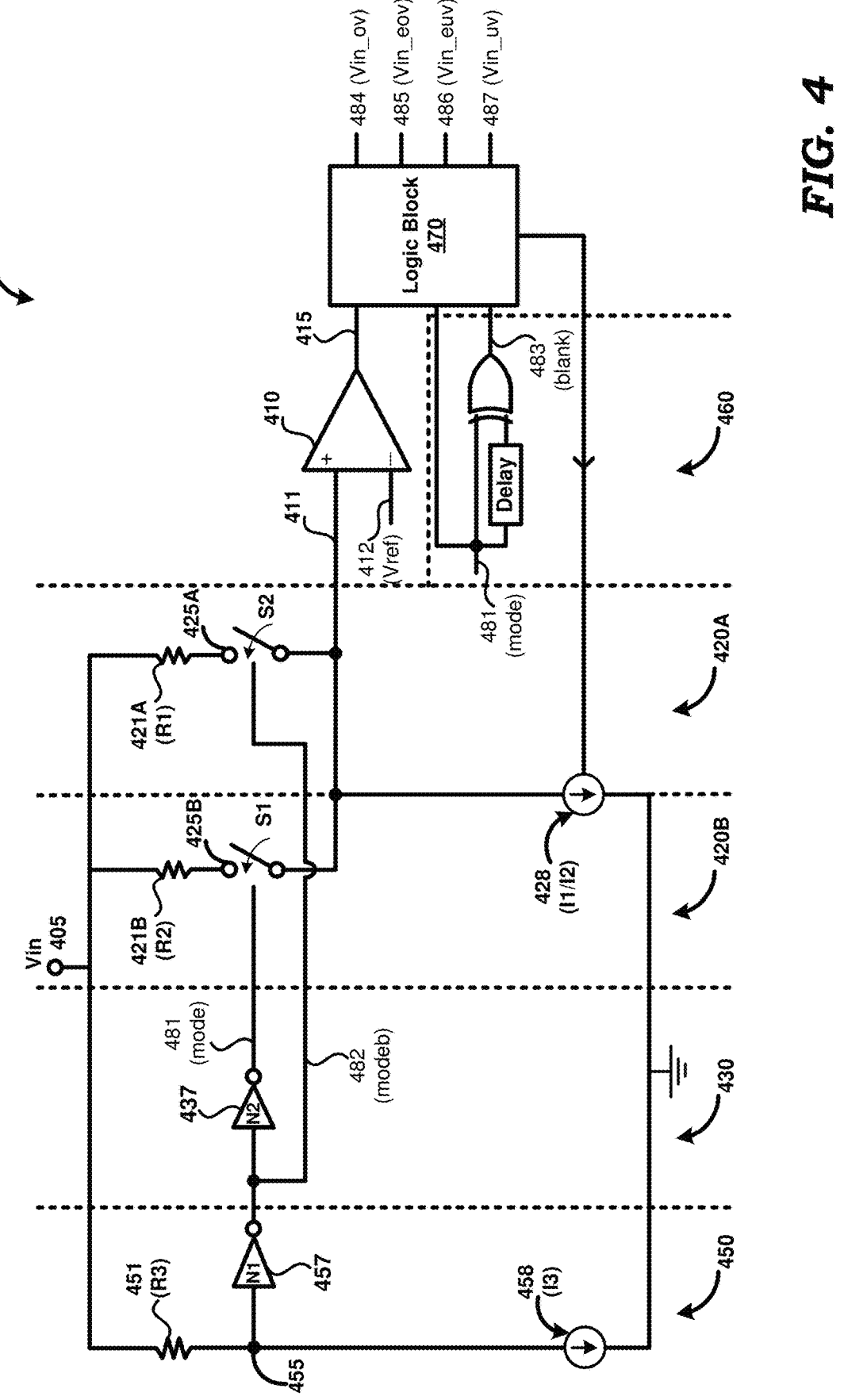
FIG. 4 illustrates a single comparator-based comparison circuit according to aspects of the present disclosure.

FIG. 4 illustrates a single comparator-based comparison circuit according to aspects of the present disclosure. Broadly, comparison circuit 400 is shown containing comparator 410, branch circuits 420A and 420B, selection circuit 430, mode selector (circuit) 450, logic input (circuit) 460 and logic block 470. Input voltage Vin is received at node 405 by connection of node 405 to line 201 of FIG. 3. Each of the circuits/blocks of the Figures is described in detail below.

Comparator 410 compares a comparator input (provided at the non-inverting "+" input 411) and a comparator reference (voltage Vref) at the inverting (−) input (412), and generates a comparator output at node 415. A value of logic 0 (LOW) of comparator output 415 indicates that the comparator input voltage (sensing voltage) is less than voltage Vref. Contrarily, a value of logic 1 (HIGH) of comparator output 415 indicates that the comparator input voltage is greater than Vref. For illustration, it is assumed that voltage Vref is 1.3V, though any convenient value may be chosen for Vref, since if Vref is different from 1.3V then the values for the resistors and current sources of comparison circuit 400 may also need to be correspondingly different.

Broadly, multiple comparisons are implemented using the single comparator (410) and different modes of operation, each mode defining a different reference voltage sought to be compared with Vref. For illustration, the description is continued assuming that there are 2 modes of operation corresponding to under-voltage and over-voltage. However, in alternative embodiments, multiple modes may be defined and used as the basis of comparison with correspondingly greater number of different reference voltages, as will be apparent to a skilled practitioner by reading the disclosure provided herein.

As will be clear from the description below, for 2 modes, a mode (value) indicates whether the comparator output (415) represents comparison with respect to a lower reference voltage or a higher reference voltage, with the comparator output (415) indicating whether the input voltage (Vin) is above or below the specific reference voltage thus compared.

Each of branch circuits 420A and 420B operates to provide a corresponding voltage drop (relative to Vin) suitable for the respective mode of operation, with the resulting voltage feeding the comparator input (+). Specifically, branch 420A shown containing resistor 421A (R1), current source 428 (I1) and switch S2 coupled in series to cause a voltage drop of I1*R1 between nodes 405 (Vin) and 425A. Branch 420B shown containing resistor 421B (R2), current source 428 (I2) and switch S1 coupled in series to cause a voltage drop of I2*R2 between nodes 405 (Vin) and 425B.

It may be appreciated that any desired values of R and I may be chosen for each of the branches/modes of operation. In general, each reference/threshold voltage (such as the lower reference and the higher reference noted above) is defined by:

$$Vth = Vref + R*I;$$

wherein,

Vth is the reference/threshold voltage;

Vref is the fixed voltage applied at the (−) terminal of comparator 410; and '*' represents the multiply operator.

The resistor R is selected in such a way that the current I is easy to implement. For example, a 4.2V threshold/reference voltage may be implemented using a 100 k (100,000 ohms) resistor and 29 uA (micro-Amperes) of current. The same resistor R could also be used for a 22V threshold/reference voltage, but that would require 187 uA of current which may be unnecessarily high for the current implementation (for example in an SPS). Similarly, using a 900 k resistor for implementing a 4.2V threshold would make the current small, which may have other repercussions like a slow start-up time.

For illustration, it is assumed that R1=100 k and I1=29 uA, thereby giving the lower reference value (Vin_uv) of 4.2V (=1.3 V+100 k*29 uA) for branch 420A, and that R2=900 k and I2=23 uA thereby giving the higher reference value (Vin_ov) of 22V (=1.3+900 k*23 uA) for branch 420B. It may be appreciated that the voltage drop in each branch is designed to be equal to the difference between the corresponding reference voltage (lower or higher) and the comparator reference voltage (Vref). With the values of R1, I1, R2 and I2 as noted above, the voltage drops across R1 and R2 are respectively 2.9V and 20.7V respectively. The above-noted values of I1 and I2 are modified to change the detection thresholds during operation, as explained in detail below.

Mode selector (circuit) 450 generates a mode (value) used to select the specific one of the different branches (modes of operations) to be connected to the non-inverting terminal (+) of comparator 410. Since the embodiment described herein has only two modes, mode selector 450 generates as the mode value, a first logic value (1) if the input voltage Vin is below a 'mid-voltage' (or mode-crossing voltage) and a second logic value (0) otherwise. The 'mid-voltage' may represent any convenient value between the lower (Vin_uv) and higher (Vin_ov) reference voltages.

According to an aspect, the mode selection is done based on an IR voltage drop, with the resulting voltage feeding an inverter 457 (N1). As such, mode selector 450 is shown containing resistor 451 (R3) and current source 458 (I3) coupled in series between Vin and ground to generate a voltage drop (R3*I3) and thereby generate a voltage at node 455 equal to [Vin−(R3*I3)].

In an embodiment, R3-800 k and 13=10 uA, and the corresponding voltage drop across resistor R3 is 8V. The logic trip point of N1 defines the mode-threshold voltage of Vin. Inverter N1 is connected to node 455 to generate at its output the mode value of 1 when Vin<=8V+VtripN1, and the mode value of 0 when Vin>8V+VtripN1; wherein VtripN1 is the trip point of inverter N1. In an embodiment, Vcc equals 3.3 V, and VtripN1 equals Vcc/2, i.e., 1.65V.

Selection circuit 430 receives the mode value from mode selector 450, and turns ON (closes) or OFF (opens) the switches S1 and S2 correspondingly. Specifically, selection circuit 430 connects the output of the inverter N1 (at 482 referred to as "modeb") contained in mode selector 450 to open/close switch S2. Selection circuit 430 also includes another inverter 437 (N2) coupled in series with the first inverter (N1), the output (at 481 referred to as "mode") of N2 being coupled to open/close switch S1.

When Vin<=[8V+VtripN1], modeb=1 and mode=0, thereby causing switch S2 to be ON and switch S1 to be OFF. In other words, branch 420A corresponding to comparing against the lower reference value (Vin_uv) is enabled (i.e., connected to comparator input '+'). When Vin> [8V+VtripN1], modeb=0 and mode=1, thereby causing switch S2 to be OFF and switch S1 to ON. In other words, the branch 420B corresponding to comparing against the higher reference value (Vin_ov) is enabled. Thus, mode and modeb together enable different switches which select the respective branches for under voltage or over voltage sensing.

Thus, comparison circuit 400 employs a single comparator (410)-based comparison of an input voltage (Vin) with multiple reference voltages (Vin_uv and Vin_ov). Such a comparison circuit 400 may be implemented as part of voltage-sense block 350 to determine whether input voltages (such as Vin) are in optimal working range. The operation of the different components of comparison circuit 400 in different scenarios (input voltages) is described below with examples.

6. Operation

It is assumed that Vcc of 3.3V (shown in FIGS. 2 and 3) is already applied to the various components of power stage 230-1. Upon application of (or switching-ON) of Vin, voltage Vin starts ramping up from 0V. As noted above, until Vin reaches [8V+VtripN1], branch 420A is connected to the non-inverting terminal (+) of comparator 410. With fixed Vref of 1.3V, when Vin crosses (and rises above) 4.2V (Vin_uv as noted above), output 415 of comparator 410 switches from logic LOW to logic HIGH. In response to 415 becoming logic HIGH, logic block 470 reduces the previously programmed value of I1 by a pre-determined value (e.g., 1 uA). This ensures that the original under-voltage threshold (Vth_uv) is increased by a corresponding voltage value such that thereafter, an under-voltage is detected when Vin falls below the new threshold voltage (Vth_euv). Thus, hysteresis is provided for under-voltage detection.

Thereafter, as Vin continues to rise above 4.2V, when Vin crosses [8V+VtripN1] (i.e., the lower reference voltage Vin_uv), the mode changes, and branch 420B gets connected to the non-inverting terminal (+) of comparator 410 (with branch 420A disconnected therefrom). At, or slightly after, the mode change, Vin is still less than 22V, and therefore (Vin−I2*R2) is less than Vref of 1.3V, and output 415 of comparator 410 is again a logic LOW. The initial value of I2 is programmed (e.g., to 24 uA) to set the over-voltage threshold at 21V (early over-voltage threshold, Vth_eov). As Vin continues to rise, when/if Vin crosses (and rises above) 21V, output 415 of comparator 410 switches from logic LOW to logic HIGH.

Sometime after 415 becomes logic HIGH, logic block 470 reduces the previously programmed value of I2 (e.g., to 23 uA). This ensures that the early over-voltage threshold (Vth_eov) is increased by a corresponding voltage value such that thereafter, an over-voltage is detected when Vin rises above the new threshold voltage (Vth_ov, 22V). Thus, hysteresis is provided for over-voltage detection also. Hysteresis for both under-voltage and over-voltage detection ensures that when Vin is either at or very close to the respective thresholds, the comparator output does not repeatedly switch between logic HIGH and logic LOW because of noise on Vin.

It may be appreciated that the values of comparator output 415 and mode/modeb may be logically combined to generate final logic signals for indicating an under-voltage condition, an over-voltage condition, etc. Such logic signals may be processed, and in the event of abnormal condition of Vin, be used as the basis to disable (switch OFF) both the power switches 320 and 330, and to signal phase controller 210 of such abnormal condition.

The manner in which such logic signals may be generated as the outputs of comparison circuit 400 is described below with examples.

7. Generating Logic Outputs

Referring again to FIG. 4, blanking circuit 460 generates a blanking pulse (at 483 referred to as 'blank') that is asserted for a brief duration when the mode changes from 1 to 0 or 0 to 1. Blanking circuit 460 is realized using a delay element and an XOR gate, in the example shown here. Signal 'blank' is asserted for a duration equal to the delay provided by the delay block, and may be used by logic block 470 to ensure that proper logic outputs are generated only after the switching transients/effects (glitches) caused by switching between the different branches have died out.

Logic block 470 contains logic circuits (not shown) for generating the desired logic outputs based on the values of mode, comparator output (415) and the blanking pulse. In the embodiment shown herein, logic block 470 also includes logic circuits to switch the current source magnitudes (29 uA or 23 uA) upon a change in mode.

In one embodiment, combining the comparator output (415), the mode signal and blank signal in logic block 470 defines the state of each of the 4 logic outputs, namely:

Vin_ov (484) for indicating an over-voltage condition,

Vin_eov (485) for indicating an early over-voltage condition that may act as an early indication or warning of an over-voltage condition, Vin_uv (486) for indicating an under-voltage condition, and Vin_euv (487) for indicating an early under-voltage condition that may act as an early indication or warning of the under-voltage condition.

It should be noted that the logical circuits for generating the above noted 4 signals may be designed in a convenient and known way. For example, an AND gate taking as inputs the values of modeb, the inverse of signal 415 and the inverse of 'blank' may be used for generating Vin_uv signal with a logic HIGH to indicate under-voltage condition. Similarly, another AND gate taking as inputs the values of mode, signal 415 and the inverse of 'blank' may be used for generating Vin_ov signal with a logic HIGH to indicate an over-voltage condition. The output of an OR gate taking as inputs signals Vin_ov (484) and Vin_uv (486) may be provided on path 351 noted above.

Figure 5:
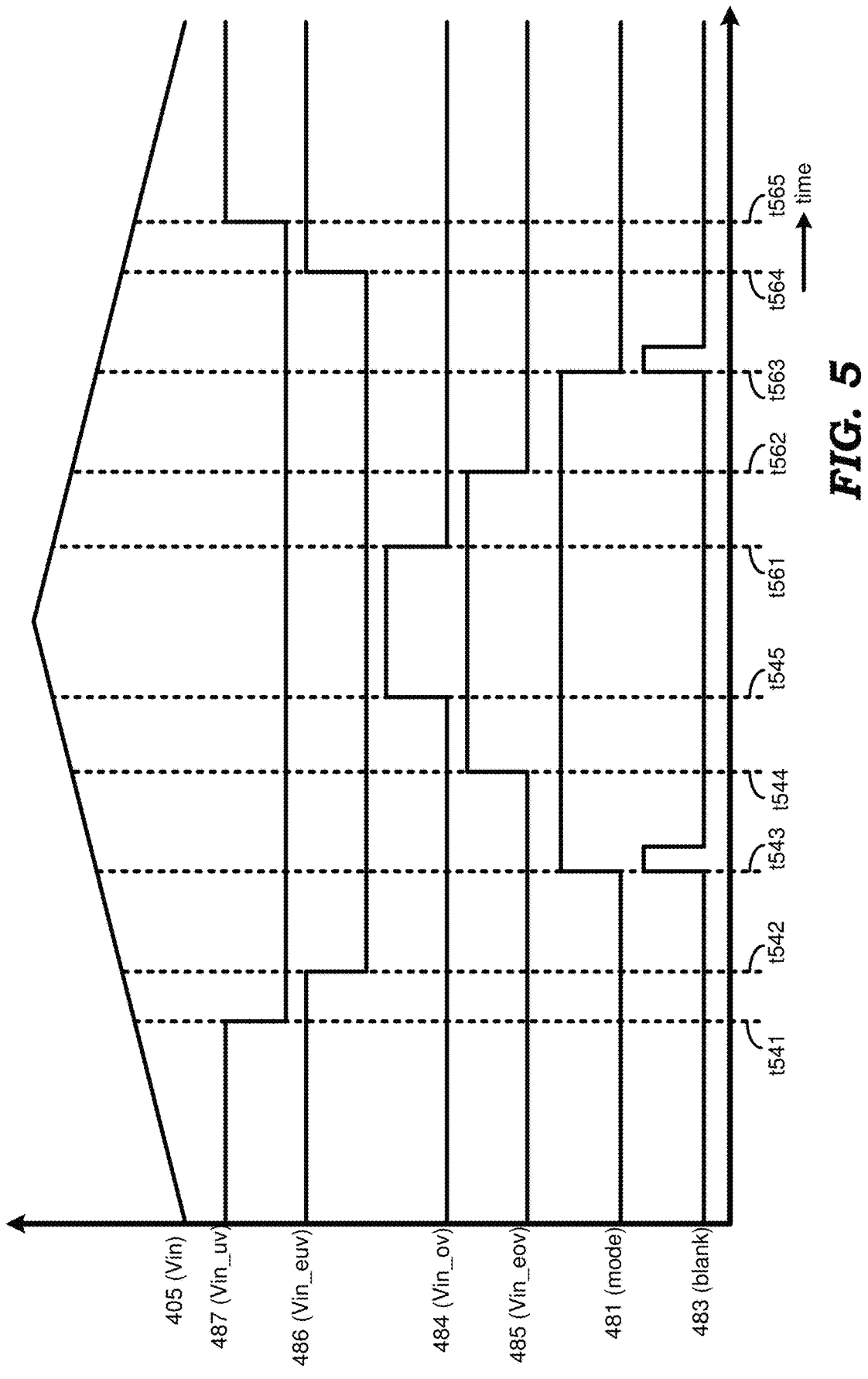
FIG. 5 is a timing diagram showing the waveforms of signals generated based on the outputs of a single comparator-based comparison circuit in one embodiment.

FIG. 5 is a timing diagram showing the waveforms of signals generated based on the outputs of a single-comparator-based comparison circuit in an embodiment. Specifically, the Figure shows the waveforms of signals Vin (405), Vin_uv (486), Vin_euv (487), Vin_ov (484), Vin_eov (485), mode (481) and blank (483).

In a situation where Vin is ramping up from zero, mode and all logic outputs are low except Vin_euv and Vin_uv which are high. When Vin crosses (at t541) and rises above the under-voltage reference/threshold voltage (Vth_uv=4.2V), Vin_uv signal becomes a logic LOW. When Vin crosses (at t542) and rises above the early under-voltage threshold (Vth_euv=5V in an embodiment), the early under-voltage signal (Vin_euv) goes low. Vin keeps ramping up and crosses the mode-crossing voltage (Vth_mode=8V+VtripN1) at t543 and mode becomes high.

It may be appreciated that due to settling delays the outputs will glitch when the mode switches, specifically due to the resistor branch changing. Hence, the fixed-width blanking pulse is generated that locks the outputs at the correct logic level until the circuit settles. When mode changes from 0 to 1, the resistor branch switches and the threshold changes to that needed for over-voltage detection. When Vin crosses (at t544) the early over-voltage threshold (Vth_eov=21V in an embodiment), Vin_eov signal goes high. Then, when Vin reaches the over-voltage threshold (Vth_ov=22V) at t545, Vin_ov signal goes high.

Contrarily, in a situation where Vin is ramping down from the highest voltage, all signals are high except Vin_uv and Vin_euv. When Vin crosses Vth_ov at t561, Vin_ov signal becomes low. When Vin crosses Vth_eov at t562, Vin_eov signal becomes low. When Vin crosses Vth_mode at t563, mode becomes low and a blank signal (pulse) is generated to avoid the settling glitch. When Vin crosses Vth_euv at t564, Vin_euv signal becomes high. When Vin crosses Vth_uv at t565, Vin_uv signal becomes high.

Ramp waveforms for Vin are shown in FIG. 5 for ease of illustration. The logic levels of the logic signals shown in FIG. 5 are correct even if the circuit of FIG. 4 starts operation (or is switched ON) after Vin has already settled to its final value (any value in the ramp shown in FIG. 5).

Thus, voltage-sense block 350 senses whether Vin (201) is below the under-voltage threshold or greater than the over-voltage threshold using a single comparator (410) and dual mode of operation. Such a dual-mode design has a seamless transition between modes and also allows for the detection of 4 conditions (under-voltage, early under-voltage, over-voltage and early over-voltage). It may be further appreciated that such a design is an integrated area-efficient and lower-power solution that can be used on-chip without external devices.

8. Conclusion

References throughout this specification to "one embodiment", "an embodiment", or similar language means that a particular feature, structure, or characteristic described in connection with the embodiment is included in at least one embodiment of the present disclosure. Thus, appearances of the phrases "in one embodiment", "in an embodiment" and similar language throughout this specification may, but do not necessarily, all refer to the same embodiment.

While in the illustrations of the Figures, although terminals/nodes are shown with direct connections to (i.e., "connected to") various other terminals, it should be appreciated that additional components (as suited for the specific environment) may also be present in the path, and accordingly the connections may be viewed as being "electrically coupled" to the same connected terminals.

It should be appreciated that the specific type of transistors (such as NMOS, PMOS, etc.) noted above are merely by way of illustration. However, alternative embodiments using different configurations and transistors will be apparent to one skilled in the relevant arts by reading the disclosure provided herein. For example, the NMOS transistors may be replaced with PMOS (P-type MOS) transistors, while also interchanging the connections to power and ground terminals.

Accordingly, in the instant application, the power and ground terminals are referred to as constant reference potentials, the source (emitter) and drain (collector) terminals of transistors (though which a current path is provided when turned on and an open path is provided when turned off) are termed as current terminals, and the gate (base) terminal is termed as a control terminal.

While various embodiments of the present disclosure have been described above, it should be understood that they have been presented by way of example only, and not limitation. Thus, the breadth and scope of the present disclosure should not be limited by any of the above-described embodiments, but should be defined only in accordance with the following claims and their equivalents.

What is claimed is:

1. A comparison circuit comprising:
   a comparator to compare a comparator input with a comparator reference and generate a comparator output;
   a mode selector to generate as a mode value, a first logic value if an input voltage is below a mid-voltage and a second logic value otherwise, wherein said mid-voltage is between a first reference voltage and a second reference voltage of interest, wherein said first reference voltage is lower than said second reference voltage;
   a first branch coupled to receive said input voltage at a first node, and generate a first voltage drop relative to said input voltage at a second node, wherein said first voltage drop approximately equals a difference between said first reference voltage and said comparator reference;
   a second branch coupled to receive said input voltage at said first node, and generate a second voltage drop relative to said input voltage at a third node, wherein said second voltage drop approximately equals a difference between said second reference voltage and said comparator reference;
   a selection circuit to couple one of said second node or said third node as said comparator input according to said mode value, wherein said mode value indicates whether said comparator output represents comparison with respect to said first reference voltage or said second reference voltage, and said comparator output indicates whether said input voltage is above or below a specific one of said first reference voltage or said second reference voltage compared with.

2. The comparison circuit of claim 1, wherein said first branch comprises a first resistor and a first switch coupled in series, wherein a first current flowing through said first resistor generates said first voltage drop, wherein said second branch comprises a second resistor and a second switch coupled in series, wherein a second current flowing through said second resistor generates said second voltage drop, wherein said selection circuit turns on only one of said first switch and said second switch based on said mode value.

3. The comparison circuit of claim 2, wherein said mode selector comprises:

a third resistor and a third current source in series with said first node to together generate a voltage drop equaling said mid-voltage relative to said input voltage at a fourth node; and a first inverter connected to said fourth node to generate said mode value.

4. The comparison circuit of claim 3, wherein said selection circuit comprises:

a second inverter coupled in series to said first inverter, wherein an output of said second inverter is coupled to said first switch, and an output of said first inverter is coupled to said second switch.

5. The comparison circuit of claim 4, wherein said input voltage is an instantaneous voltage of an input signal.

6. The comparison circuit of claim 2, wherein said both of said first current and said second current are generated by a single current source, said comparison circuit further comprising a logic block, wherein said single current source is operable to generate current of a magnitude determined by a value set by said logic block, said logic block setting said value based on said mode value, wherein said logic block sets said value to a first value to cause said single current source to generate said first current, thereby forming said first voltage drop across said first resistor, and wherein said logic block sets said value to a second value to cause said single current source to generate said second current, thereby forming said second voltage drop across said second resistor.

7. The comparison circuit of claim 6, further comprising a blanking circuit, said blanking circuit to receive said mode value as an input and to generate a blanking pulse.

8. The comparison circuit of claim 7, wherein said logic block receives said comparator output, said mode value and said blanking pulse as respective inputs, said logic block to process said respective inputs to generate a first output signal, a second output signal, a third output signal and a fourth output signal, wherein if said instantaneous voltage of said input signal is less than a first trip-point voltage, said logic block sets each of said first output signal and said second output signal to a first logic state, and each of said third output signal and said fourth output signal to a second logic state, wherein if said instantaneous voltage of said input signal is between said first trip-point voltage and a second trip-point voltage, said logic block sets said second output signal to a first logic state, and each of said first output signal, said third output signal and said fourth output signal to said second logic state, wherein if said instantaneous voltage of said input signal is between a third trip-point voltage and a fourth trip-point voltage, said logic block sets each of said first output signal, said second output signal and said third output signal to said second logic state, and said fourth output signal to said first logic state, wherein if said instantaneous voltage of said input signal is greater than a fourth trip-point voltage, said logic block sets each of said first output signal and said second output signal to said second logic state, and each of said third output signal and said fourth output signal to said first logic state, and wherein if said instantaneous voltage of said input signal is between said second trip-point voltage and a third trip-point voltage, said logic block sets all of said first output signal, said second output signal, said third output signal and said fourth output signal to said second logic state.

9. The comparison circuit of claim 8, wherein said blanking pulse is used by said logic block internally to ensure that each of said first output signal, said second output signal, said third output signal and said fourth output signal are generated only after switching transients due to switching between said first branch and said second branch have died out.

10. A power stage of a switching converter comprising:

a high-side switch and a low-side switch coupled in series between a supply source and a constant reference potential, said supply source providing an input voltage, said high-side switch and said low-side switch respectively operated by a first drive signal and a second drive signal, said first drive signal and said second drive signal to be respectively ON to drive respective currents through an inductor in a first interval and a second interval;

a gate driver to generate said first drive signal and said second drive signal based on a control signal received from a phase controller, wherein said control signal is received with a first logic level in said first interval and with a second logic level in said second interval; and a voltage-sense block comprising:

a comparator to compare a comparator input with a comparator reference and generate a comparator output, said comparator output to have a first output value when said comparator input is less than said comparator reference and a second output value otherwise;

a mode selector to generate as a mode value, a first logic value if said input voltage is below a mid-voltage and a second logic value otherwise, wherein said mid-voltage is between a first reference voltage and a second reference voltage of interest, wherein said first reference voltage is lower than said second reference voltage;

a first branch coupled to receive said input voltage at a first node, and generate a first voltage drop relative to said input voltage at a second node, wherein said first voltage drop approximately equals a difference between said first reference voltage and said comparator reference;

a second branch coupled to receive said input voltage at said first node, and generate a second voltage drop relative to said input voltage at a third node, wherein said second voltage drop approximately equals a difference between said second reference voltage and said comparator reference; and a switching circuit to couple one of said second node or said third node as said comparator input according to said mode value, wherein said mode value indicates whether said comparator output represents comparison with respect to said first reference voltage or said second reference voltage, and said comparator output indicates whether said input voltage is above or below a specific one of said first reference voltage or said second reference voltage compared with.

11. The power stage of claim 10, further comprising:

a logic block to send to said gate driver, a first signal when said mode value equals said first logic value and said comparator output equals said first output value or when said mode value equals said second logic value and said comparator output equals said second output value, and a second signal otherwise, wherein said gate driver generates said first drive signal and said second drive signal to both be OFF if said input voltage is determined to be either less than said first reference voltage or greater than said second reference voltage.

12. The power stage of claim 11, wherein said first branch comprises a first resistor and a first switch coupled in series, wherein a first current flowing through said first resistor generates said first voltage drop, wherein said second branch comprises a second resistor and a second switch coupled in series, wherein a second current flowing through said second resistor generates said second voltage drop, wherein said selection circuit turns on only one of said first switch and said second switch based on said mode value.

13. The power stage of claim 12, wherein both of said first current and said second current are generated by a single current source, said comparison circuit further comprising a logic block, wherein said single current source is operable to generate current of a magnitude determined by a value set by said logic block, said logic block setting said value based on said mode value, wherein said logic block sets said value to a first value to cause said single current source to generate said first current, thereby forming said first voltage drop across said first resistor, and wherein said logic block sets said value to a second value to cause said single current source to generate said second current, thereby forming said second voltage drop across said second resistor.

14. The power stage of claim 13, further comprising a blanking circuit, said blanking circuit to receive said mode value as an input and to generate a blanking pulse.

15. The power stage of claim 14, wherein said logic block receives said comparator output, said mode value and said blanking pulse as respective inputs, said logic block to process said respective inputs to generate a first output signal, a second output signal, a third output signal and a fourth output signal, wherein if said instantaneous voltage of said input signal is less than a first trip-point voltage, said logic block sets each of said first output signal and said second output signal to a first logic state, and each of said third output signal and said fourth output signal to a second logic state, wherein if said instantaneous voltage of said input signal is between said first trip-point voltage and a second trip-point voltage, said logic block sets said second output signal to a first logic state, and each of said first output signal, said third output signal and said fourth output signal to said second logic state, wherein if said instantaneous voltage of said input signal is between a third trip-point voltage and a fourth trip-point voltage, said logic block sets each of said first output signal, said second output signal and said third output signal to said second logic state, and said fourth output signal to said first logic state, wherein if said instantaneous voltage of said input signal is greater than a fourth trip-point voltage, said logic block sets each of said first output signal and said second output signal to said second logic state, and each of said third output signal and said fourth output signal to said first logic state, and wherein if said instantaneous voltage of said input signal is between said second trip-point voltage and a third trip-point voltage, said logic block sets all of said first output signal, said second output signal, said third output signal and said fourth output signal to said second logic state.

16. The power stage of claim 15, wherein said blanking pulse is used by said logic block internally to ensure that each of said first output signal, said second output signal, said third output signal and said fourth output signal are generated only after switching transients due to switching between said first branch and said second branch have died out.

* * * * *